United States Patent
Morii

(10) Patent No.: US 8,591,638 B2
(45) Date of Patent: Nov. 26, 2013

(54) METAL SURFACE TREATMENT AQUEOUS SOLUTION AND METHOD FOR INHIBITING WHISKERS ON A METAL SURFACE

(75) Inventor: Yutaka Morii, Saitama (JP)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 541 days.

(21) Appl. No.: 12/586,464

(22) Filed: Sep. 22, 2009

(65) Prior Publication Data

US 2010/0116870 A1 May 13, 2010

(30) Foreign Application Priority Data

Sep. 22, 2008 (JP) ................................. 2008-243264

(51) Int. Cl.
*C23C 22/05* (2006.01)
*C23C 22/48* (2006.01)
*C23C 22/00* (2006.01)

(52) U.S. Cl.
USPC .................. 106/14.13; 106/14.11; 106/14.15; 106/14.41; 106/14.42; 148/243; 148/252; 148/259; 148/260; 148/274

(58) Field of Classification Search
USPC .......................... 148/252, 243, 259, 260, 274; 106/14.11, 14.13, 14.15, 14.41, 14.42
See application file for complete search history.

(56) References Cited

U.S. PATENT DOCUMENTS

| 4,681,670 | A |   | 7/1987 | Nobel et al. | |
|---|---|---|---|---|---|
| 5,047,095 | A | * | 9/1991 | Geke et al. | 148/259 |
| 5,498,300 | A | * | 3/1996 | Aoki et al. | 148/261 |
| 5,935,348 | A | * | 8/1999 | Rossmaier | 148/243 |
| 6,361,823 | B1 |   | 3/2002 | Bokisa et al. | |
| 2003/0121570 | A1 | * | 7/2003 | Oshima et al. | 148/267 |
| 2005/0121114 | A1 | * | 6/2005 | Fernandez Gonzalez et al. | 148/252 |

FOREIGN PATENT DOCUMENTS

| EP | 0 503 389 A2 | 9/1992 |
|---|---|---|
| EP | 0 521 738 A2 | 1/1993 |
| EP | 0 770 711 A1 | 5/1997 |
| EP | 1 514 956 A1 | 3/2005 |
| WO | WO 2007/119691 A1 | 10/2007 |

OTHER PUBLICATIONS

European Search Report of corresponding European Application No. 09 15 5461.

* cited by examiner

*Primary Examiner* — Lois Zheng
(74) *Attorney, Agent, or Firm* — John J. Piskorski

(57) ABSTRACT

A tin or tin alloy plating film surface treatment aqueous solution that can reduce whiskers on the surface of a tin or tin alloy plating film, and can provide a favorable tin or tin alloy plating film using a simple method for tin or tin alloy plating films that are used on electronic components.

6 Claims, No Drawings

METAL SURFACE TREATMENT AQUEOUS SOLUTION AND METHOD FOR INHIBITING WHISKERS ON A METAL SURFACE

The present invention relates to a surface treatment solution for metals, and particularly tin or tin alloy plating films, and to a method for treating the surface of tin or tin alloy plating films. In further detail, the present invention relates to a method of preventing the occurrence of whiskers on a film surface when a tin or tin alloy plating film is formed by a tin or tin alloy plating method, and also relates to a treatment solution thereof.

Tin or tin alloy plating is widely used in electronic components such as components which require electric connecting, such as chip components, quartz oscillators, connector pins, lead frames, printed circuit boards, and is also used as an etching resistant in the manufacturing process of semiconductor devices and printed boards because of the excellent connecting properties, low cost, electrical properties, and soldering properties.

Without treatment, a plating film obtained by tin or tin alloy plating will over time form whisker-like metal deposits known as whiskers on the surface. The occurrence of whiskers is known to be more prominent on tin or tin alloy plating films on a copper base. When whiskers occur on the surface of the tin or tin alloy plating film formed on the substrate surface of an electronic component, or the like, there is a possibility that an electrical short could occur. Therefore, tin-lead alloy plating which utilizes the effect of lead in inhibiting the oxidation of tin and the growth of whiskers has conventionally been used on components where electrical connections are necessary. However, recently, the toxicity of lead is seen as a problem, and the use of lead in electronic components has become restricted. Therefore, there is a need for lead free tin or tin alloy plating.

In order to inhibit the occurrence of whiskers, a high-temperature treatment, or in other words, a reflow process is performed after forming the tin or tin alloy plating film. However, while the reflow process is recognized as having an effect of inhibiting the occurrence of whiskers, intermetallic compounds will form between the tin and the base metal because of the heat, and therefore there is a problem that the amount of pure tin in the tin film is reduced, and this may have a large effect on the connection reliability after mounting. Therefore, a tin plating film surface treatment method that can inhibit the occurrence of whiskers without performing a heat treatment or with relaxed heat treatment conditions is desirable.

Various types of solutions and surface treatment methods for treating the surface of tin films have been used in the past as methods for treating the surface of tin plating films. For example, JP2007-56286 discloses a tin plating film surface treatment aqueous solution for treating the surface of a tin plating film, containing an ammonium salt of phosphoric acid, a salt of polyphosphoric acid, or a salt of maleic acid, or the like, and having a specific pH. This document does present a salt of maleic acid, but at a pH below 4.5, desirable results cannot be achieved, the claimed elements of the present invention are not satisfied, and the useful effects of the present invention are not shown. JP2007-197791 discloses a post-plating treatment composition containing a compound having an amino nitrogen with at least two or more methylene groups bonded to a phosphonic acid group, or salt of the aforementioned compound as an essential ingredient. This document does not disclose the compound that is used with the present invention, nor the use of a surface treatment solution as a surface treatment agent for tin plating. Furthermore, in tests performed by the present inventors, when a tin plated surface is treated with the treatment solution containing the aforementioned compound, the plating film will corrode and the base will become exposed, thus proving that the compound is not preferable. JP2006-28610 discloses a method of forming a tin plating film including a peeling step of peeling a part of the tin plating film, a discoloration preventing treatment step, and a heat treatment step, in that order. This document has a peeling step in order to prevent discoloration during a heat treatment step by removing tin atoms which have adhered to regions other than the intended regions, and only electrolytic peeling is shown as a peeling step, and thus differs from the constitution of the present invention. JP2004-300466 discloses a plating surface posttreatment solution wherein a carboxylic acid derivative of 2-mercaptobenzothiazole is dissolved in an organic solvent such as alcohol and then added to water. However, the solubility of a carboxylic acid derivative of 2-mercaptobenzothiazole in water is poor and the joint use of an alcohol is required as shown in JP2004-300466, and thus the actual plating process is complicated. JP2006-307343 discloses a method of bringing a composition comprising phosphoric acid or salt thereof into contact with a metal. This document does not disclose the compound that is used with the present invention, nor the use of a surface treatment solution as a surface treatment agent.

An objective of the present invention is to provide a tin or tin alloy plating film surface treatment aqueous solution that can reduce whiskers on the surface of a tin or tin alloy plating film, and can provide a favorable tin or tin alloy plating film using a simple method for tin or tin alloy plating films that are used on electronic components.

As a result of diligent research to achieve the aforementioned objectives, the present inventors discovered that an aqueous solution to which specific organic compounds containing a carboxyl group are added has select advantages compared to aqueous solutions containing other compounds, and thus the present invention was achieved. In other words, the occurrence of whiskers on a tin or tin alloy plating film can effectively be prevented by a simple method by treating with the surface treatment aqueous solution of the present invention.

The first invention of the present application provides a tin or tin alloy plating film surface treatment aqueous solution for treating the surface of tin or tin alloy plating films, comprising an organic compound with at least one carboxyl group in the molecule, and wherein the pH is 2.5 or lower. The organic compound having at least one carboxyl group and the molecule is preferably an organic compound which has two or more carboxyl groups in the molecule and which does not have a nitrogen atom in the molecule. The organic compound with two or more carboxyl groups in the molecule and without a nitrogen atom in the molecule is preferably malic acid, maleic acid, or citric acid. Furthermore, the tin or tin alloy plating film surface treatment aqueous solution of the first invention of the present application preferably also contains a nitrogen compound.

The second invention of the present application provides a tin or tin alloy plating film surface treatment method for treating the surface of a tin or tin alloy plating film with the tin or tin alloy plating film surface treatment aqueous solution according to the first invention.

The third invention of the present application provides a method of preventing whiskers on the surface of a tin or tin alloy plating film by treating the surface of a tin or tin alloy plating film with the tin or tin alloy plating film surface treatment aqueous solution according to the first invention.

The fourth invention of the present application provides a method of manufacturing electronic components with a tin or tin alloy plating film, comprising a step of treating the surface of a tin or tin alloy plating film with any of the tin or tin alloy plating film surface treatment aqueous solutions according to the first invention, after a step of plating a substrate with tin or tin alloy.

The fifth invention of the present application provides an electronic component comprising a tin or tin alloy plating film, manufactured by an electronic component manufacturing method that includes a step of treating the surface of a tin or tin alloy plating film with a tin or tin alloy plating film surface treatment aqueous solution according to the first invention, after a step of plating a substrate with tin or tin alloy.

The abbreviations used throughout this specification have the following meaning unless otherwise designated. g=gram; mg=milligram; °C.=degree Celsius; m=meter; cm=centimeter; μm=micrometer, L=liter; mL=milliliter. The range of all values includes the boundary values, and may be combined in any order. The terms "plating solution" and "plating bath" used throughout this specification are used interchangeably and have the same meaning.

The tin or tin alloy plating film surface treatment aqueous solution of the present invention contains water and an organic compound with at least one carboxyl group in the molecule, and has a pH of 2 or lower. Examples of organic compounds which have at least one carboxyl group in the molecule include citric acid, malic acid, maleic acid, oxalic acid, glutaric acid, tartaric acid, lactic acid, gluconic acid, picolinic acid, and iminodiacetic acid, and the like, and salts thereof are also acceptable.

Of the organic compounds having at least one carboxyl group in the molecule, those which have two or more carboxyl groups in the molecule and which do not have a nitrogen atom in the molecule are preferable. Organic compounds which satisfy these conditions include, for example, citric acid, malic acid, maleic acid, and the like, and salts thereof are also acceptable. Malic acid and maleic acid are particularly preferable.

These organic compounds which have at least one carboxylic acid in the molecule are present as a compound in the surface treatment aqueous solution in a range between 0.1 and 50 g/L, preferably in a range between 5 and 30 g/L, and more preferably in a range between 5 and 20 g/L.

The tin or tin alloy film surface treatment aqueous solution of the present invention must have a pH of 2.5 or lower. If the pH is greater than 2.5, the occurrence of whiskers will increase even though an organic compound having at least one carboxyl group in the molecule is used, and therefore this is not preferable. The pH can be adjusted using any commonly known pH adjusting agent.

The tin or tin alloy plating film surface treatment aqueous solution of the present invention preferably also contains a nitrogen compound. The nitrogen compound is a compound containing a nitrogen atom in the molecule, and examples include benzotriazole and imidazole, and the like. Benzotriazole is particularly preferable. The nitrogen compound content as a compound in the surface treatment aqueous solution is between 0.1 and 10 g/L, preferably between 0.5 and 5 g/L.

The surface treatment aqueous solution of the present invention generally has a solution temperature between 0° C. and 100° C., preferably in a range between 10° C. and 70° C., and more preferably the range of room temperature (15° C. to 35° C.).

If necessary, commonly known additives such as surfactants, disinfectants, or solvents, or the like, may also be added to the present invention, but these additives are not fundamentally required. The tin or tin alloy plating film surface treatment aqueous solution of the present invention can be applied to a tin or tin alloy plating film surface by an arbitrary method that can bring the surface treatment aqueous solution in contact with the plated film surface by a commonly known method such as a method that uses an immersion process or a spray process, or the like. Generally, the surface of the tin or tin alloy film is washed by water and then the tin or tin alloy plating film surface treatment solution of the present invention is applied by immersing or spraying. The processing time is generally between 5 seconds and 120 seconds, preferably between 10 seconds and 60 seconds. Later, a water wash, distilled water rinse, and drying are generally performed in order.

The tin or tin alloy plating film surface treatment aqueous solution of the present invention is suitable for treating tin or tin alloy plating films of components which require electrical connections, for example. Examples of components which require electrical connections include chip components such as chip resistors and chip capacitors, connector pins, bumps, printed circuit boards, lead frames, and other electronic components.

Next, the present invention will be described in detail by presenting embodiments and comparative examples.

The occurrence of whiskers and the plating film thickness of the embodiments and the comparative examples were evaluated as shown below. Furthermore, the appearance after treating with the surface treatment solution was observed by the naked eye, and those cases where a favorable plating film was not obtained because the base was exposed through the tin plating film, or the like, are shown in the table.

(1) Occurrence of Whiskers

A tin plating film treated with the surface treatment solution was allowed to sit for three days at room temperature, and after three days, the number of whiskers formed was counted using a metal microscope. Evaluation was made using the following four levels, based on the number of whiskers that occurred.

O: Very few (between approximately 0 and 3)
1: Few (between approximately 4 and 9)
2: Many (between approximately 10 and 49)
3: Very many (50 or more)

(2) Plating Film Thickness

The tin plating film that had been treated with a surface treatment aqueous solution was measured using a florescent x-ray measuring device.

EMBODIMENTS 1~13 AND COMPARATIVE EXAMPLES 1~14

A patterned two layer CCL material was etched for 30 seconds at room temperature, and then washed in order with deionized water, 5% sulfuric acid, and again with deionized water, and then dried. Electroless tin plating was performed for 3 minutes at a bath temperature of 65° C. using a commonly known methanesulfonic acid tin plating bath. After washing with deionized water, the samples were immersed for 60 seconds at room temperature in one of the surface treatment aqueous solutions of Embodiments 1 through 8 shown in Table 1 or one of Comparative Examples 1 through 14 shown in Table 2. Next, the samples were washed in deionized water, dried, left for three days at room temperature, and then subjected to the various evaluations. The evaluation results are shown in Table 1 and Table 2.

TABLE 1

Embodiment 1 through 13

| Embodiment | Surface treatment aqueous solution | | | | | Results | |
| | Organic compound containing a carboxyl group | Concentration (g/L) | Nitrogen compound | Concentration (g/L) | PH | Whiskers (4 level evaluation) | Film thickness (μm) |
|---|---|---|---|---|---|---|---|
| 1 | Malic acid | 10 | — | — | 2.27 | 0 | 0.51 |
| 2 | Maleic acid | 10 | — | — | 1.54 | 0 | 0.47 |
| 3 | Maleic acid | 25 | Benzotriazole | 0.5 | 1.54 | 1 | 0.50 |
| 4 | Maleic acid | 20 | Benzotriazole | 0.5 | 1.54 | 0 | 0.50 |
| 5 | Maleic acid | 15 | Benzotriazole | 0.5 | 1.54 | 0 | 0.48 |
| 6 | Maleic acid | 10 | Benzotriazole | 0.5 | 1.54 | 0 | 0.47 |
| 7 | Maleic acid | 5 | — | — | 1.60 | 0 | 0.49 |
| 8 | Iminodiacetic acid | 10 | — | — | 2.29 | 1 | 0.53 |
| 9 | Citric acid | 10 | — | — | 2.2 | 1 | 0.50 |
| 10 | Oxalic acid | 5 | — | — | 2.5 | 1 | 0.48 |
| 11 | Formic acid | 10 | — | — | 2.2 | 0 | 0.49 |
| 12 | Lactic acid | 10 | — | — | 2.5 | 1 | 0.50 |
| 13 | Lactic acid | 10 | Benzotriazole | 0.5 | 2.5 | 1 | 0.51 |

TABLE 2

Comparative Example 1 through 14

| Comparative Example | Surface treatment aqueous solution | | | | | Results | | Comments |
| | Organic compound containing a carboxyl group | Concentration (g/L) | Nitrogen compound | Concentration (g/L) | PH | Whiskers (4 level evaluation) | Film thickness (μm) | |
|---|---|---|---|---|---|---|---|---|
| 1 | — | — | — | — | | 3 | 0.48 | Blank |
| 2 | Maleic acid | 5 | | | 3 | 3 | 0.49 | |
| 3 | Maleic acid | 5 | | | 4 | 3 | 0.49 | |
| 4 | — | — | Benzotriazole | 0.5 | 5 | 2 | 0.51 | |
| 5 | Phosphonic acid | 10 | — | — | 1.26 | 2 | 0.49 | Copper exposed |
| 6 | Aminotrimethylene phosphonic acid | 10 | — | — | 1.58 | 2 | 0.49 | Copper exposed |
| 7 | 1-hydroxyethylene-1,1-diphosphonic acid | 10 | — | — | 1.70 | 2 | 0.47 | Copper exposed |
| 8 | Picolinic acid | 10 | — | — | 3.36 | 3 | 0.50 | |
| 9 | Ascorbic acid | 10 | — | — | 2.74 | 3 | 0.49 | |
| 10 | (2-benzothiazolyl thio) acetic acid | 5 | | | 2.5 | | | Not soluble in water |
| 11 | 3-(2-benzothiazolyl thio) propionic acid | 5 | | | 2.5 | | | Not soluble in water |
| 12 | Gluconic acid | 20 | — | — | 2.6 | 2 | 0.52 | |
| 13 | Glutaric acid | 10 | — | — | 2.71 | 2 | 0.47 | |
| 14 | Phosphoric acid | 10 | — | — | <1 | 2 | 0.48 | Etching |

The surface treatment aqueous solutions of the embodiments prepared with an organic compound containing a carboxyl group and having a pH of 2.5 or less were clearly found to have fewer whiskers on the tin plating film than samples treated with the surface treatment aqueous solutions of the comparative examples.

Comparative Examples 2 and 3 were prepared with surface treatment aqueous solutions where the pH was adjusted to 3 and 4 respectively, by adding an alkali. With these surface treatment aqueous solutions, the effect of inhibiting whiskers was minimal.

With Comparative Examples 5 through 7, a phosphonic acid-based organic compound was used. These compounds provided a certain degree of whisker-inhibiting effect, but the whisker-inhibiting effect was lower than that of the present invention which used an organic compound containing a carboxyl group, and the corrosion was severe so the copper base was exposed. Note, the aminotrimethylene phosphonic acid of Comparative Example 6 is a compound shown in JP2007-197791.

The organic compounds of Comparative Examples 10 and 11 had low solubility in water, were cloudy, and did not form a uniform aqueous solution, and therefore were not suitable for use as a surface treatment solution. Note, Comparative Examples 10 and 11 used a compound shown in JP2004-300466.

Comparative Example 14 used phosphoric acid which is a compound shown in JP2006-307343. Phosphoric acid provided a certain degree of whisker-inhibiting effect, but the effect was lower than the organic compound containing a carboxyl group of the present invention.

By using the tin or tin alloy plating film surface treatment solution of the present invention, the occurrence of whiskers on a tin or tin alloy plating film can be effectively prevented by a simple method.

What is claimed is:

1. A tin or tin alloy plating film surface treatment aqueous solution consisting of an organic compound chosen from citric acid, malic acid, maleic acid, oxalic acid, glutaric acid, tartaric acid, lactic acid, gluconic acid, picolinic acid, iminodiacetic acid or salts thereof and a nitrogen containing compound chosen from benzotriazole or imidazole, water and optionally one or more additives selected from the group consisting of surfactants, solvents and disinfectants, the pH of the surface treatment aqueous solution is 2.5 or lower.

2. The tin or tin alloy plating film surface treatment aqueous solution of claim 1, wherein the concentration of the nitrogen containing compound is from 0.1-10 g/L.

3. The tin or tin alloy plating film surface treatment aqueous solution of claim 1, wherein the organic compound is chosen from malic acid, maleic acid or salts thereof.

4. The tin or tin alloy plating film surface treatment aqueous solution of claim 1, wherein the organic compound ranges between 0.1 and 50 g/L.

5. The tin or tin alloy plating film surface treatment aqueous solution of claim 4, wherein the organic compound ranges between 5 and 30 g/L.

6. The tin or tin alloy plating film surface treatment aqueous solution of claim 5, wherein the organic compound ranges between 5 and 20 g/L.

* * * * *